United States Patent
Buchanan

(10) Patent No.: US 10,347,352 B2
(45) Date of Patent: Jul. 9, 2019

(54) DISCRETE-TIME ANALOG FILTERING

(71) Applicant: Hewlett Packard Enterprise Development LP, Houston, TX (US)

(72) Inventor: Brent Buchanan, Palo Alto, CA (US)

(73) Assignee: Hewlett Packard Enterprise Development LP, Houston, TX (US)

(\*) Notice: Subject to any disclaimer, the term of this patent is extended or adjusted under 35 U.S.C. 154(b) by 0 days.

(21) Appl. No.: 15/500,568

(22) PCT Filed: Apr. 29, 2015

(86) PCT No.: PCT/US2015/028208
§ 371 (c)(1),
(2) Date: Jan. 31, 2017

(87) PCT Pub. No.: WO2016/175781
PCT Pub. Date: Nov. 3, 2016

(65) Prior Publication Data
US 2017/0221579 A1    Aug. 3, 2017

(51) Int. Cl.
G11C 27/02    (2006.01)
G11C 13/00    (2006.01)
G11C 27/00    (2006.01)
H03H 15/00    (2006.01)

(52) U.S. Cl.
CPC .......... *G11C 27/02* (2013.01); *G11C 13/0002* (2013.01); *G11C 13/004* (2013.01); *G11C 13/0007* (2013.01); *G11C 27/00* (2013.01); *H03H 15/00* (2013.01)

(58) Field of Classification Search
None
See application file for complete search history.

(56) References Cited

U.S. PATENT DOCUMENTS

| | | | |
|---|---|---|---|
| 4,939,516 A * | 7/1990 | Early | ............... H03F 1/304 327/124 |
| 561,705 A | 4/1997 | Adrian et al. | |
| 7,295,140 B2 | 11/2007 | Chuang | |
| 8,064,248 B2 | 11/2011 | Lung | |
| 8,225,180 B2 | 7/2012 | Jiang et al. | |
| 8,284,605 B2 | 10/2012 | Tanaka et al. | |
| 8,570,200 B2 | 10/2013 | Ashburn, Jr. et al. | |

(Continued)

FOREIGN PATENT DOCUMENTS

WO    WO-2011088526 A1    7/2011
WO    WO-2012106080    8/2012

OTHER PUBLICATIONS

Gao, G., et al., Analog-Input Analog-Weight Dot-Product Operation with Ag/a-Si/Pt Memristive Devices [online], Jul. 17, 2012, University of California Santa Barbara, Retrieved from the Internet: <https://www.ece.ucsb.edu/~strukov/papers/2012/VLSISOCdp2012.pdf>, [retrieved on Mar. 12, 2015], 8 pages.

(Continued)

*Primary Examiner* — Lincoln D Donovan
*Assistant Examiner* — Khareem E Almo
(74) *Attorney, Agent, or Firm* — Hewlett Packard Enterprise Patent Department

(57) ABSTRACT

According to an example, discrete-time analog filtering may include receiving an input signal, and sampling the input signal to determine sampled input signal values related to the input signal.

14 Claims, 14 Drawing Sheets

(56) References Cited

U.S. PATENT DOCUMENTS

| | | |
|---|---|---|
| 8,629,793 B2 | 1/2014 | Tsia |
| 8,917,198 B2 | 12/2014 | Pagnanelli |
| 9,147,463 B1* | 9/2015 | Sarraju ............... G11C 11/4076 |
| 9,743,024 B2* | 8/2017 | Tyrrell ................. H04N 5/335 |
| 9,772,935 B2* | 9/2017 | Kan ........................ G06F 12/00 |
| 9,875,209 B2* | 1/2018 | Mishra ............... H04L 25/4902 |
| 2005/0216545 A1 | 9/2005 | Aldrich et al. |
| 2008/0013784 A1 | 1/2008 | Takeshima et al. |
| 2009/0154222 A1 | 6/2009 | Chien et al. |
| 2009/0310406 A1* | 12/2009 | Sarin .................. G11C 11/5628 365/185.03 |
| 2011/0182104 A1 | 7/2011 | Kim et al. |
| 2011/0235409 A1 | 9/2011 | Kang et al. |
| 2012/0011092 A1 | 1/2012 | Tang et al. |
| 2012/0069630 A1 | 3/2012 | Xi et al. |
| 2012/0087175 A1 | 4/2012 | Zhu et al. |
| 2012/0105143 A1 | 5/2012 | Strachan et al. |
| 2013/0051123 A1 | 2/2013 | Lee et al. |
| 2013/0106462 A1 | 5/2013 | Yang et al. |
| 2013/0166972 A1 | 6/2013 | Seabury et al. |
| 2013/0215669 A1 | 8/2013 | Haukness |
| 2013/0293161 A1 | 11/2013 | Al Dibs et al. |
| 2014/0003139 A1 | 1/2014 | Pickett et al. |
| 2014/0025613 A1 | 1/2014 | Ponulak |
| 2014/0027702 A1 | 1/2014 | Lu et al. |
| 2014/0149773 A1 | 5/2014 | Huang et al. |
| 2014/0215121 A1 | 7/2014 | Ordentlich et al. |
| 2015/0347896 A1* | 12/2015 | Roy ........................ G11C 11/54 365/148 |
| 2018/0069536 A1* | 3/2018 | Roy ........................ G11C 11/54 |
| 2018/0113649 A1* | 4/2018 | Shafiee Ardestani ........................ G06F 3/0613 |

OTHER PUBLICATIONS

International Searching Authority, The International Search Report and the Written Opinion, PCT/US2015/028208, dated Feb. 23, 2016, 12 Pages.

Jung Jg. et al., Spread Programming Using Orthogonal Code for Alleviating Bit Errors of NAND Flash Memory, IEEE, Jan. 9-13, 2010, P1-9, pp. 1-2.

Kim, S., et al.; "Flexible Memristive Memory Array on Plastic Substrates"; Oct. 25, 2011, American Chemical Society, Nano Letters 2011, No. 11, pp. 5438-5442.

PCT; "Notification of Transmittal of the International Search Report and the Written Opinion of the international Searching Authority, or the Declaration"; cited in PCT/US2014/048435 dated Feb. 24, 2015; 12 pages.

PCT; "Notification of Transmittal of the International Search Report and the Written Opinion of the International Searching Authority, or the Declaration"; cited in PCT/US2014/062948 dated Jun. 30, 2015; 11 pages.

Zangeneh, M., et al.; "Design and Optimization of Nonvolatile Multibit 1t1r Resistive RAM"; Aug. 2014; IEEE Transactions on Very Large Scale Integration (VLSI) Systems, vol. 22, No. 8, pp. 1815-1828.

\* cited by examiner

DISCRETE-TIME ANALOG FILTERING

STATEMENT OF GOVERNMENT RIGHTS

This invention was made with Government support. The Government has certain rights in the invention.

BACKGROUND

Resistive random-access memory (RRAM) is a type of non-volatile (NV) random-access (RAM) computer memory that operates by changing the resistance across a dielectric solid-state material. An example of a RRAM is a memristor. RRAM may be used to store data and to perform various operations related to the stored data.

BRIEF DESCRIPTION OF DRAWINGS

Features of the present disclosure are illustrated by way of example and not limited in the following figure(s), in which like numerals indicate like elements, in which.

DETAILED DESCRIPTION

Figure 1:
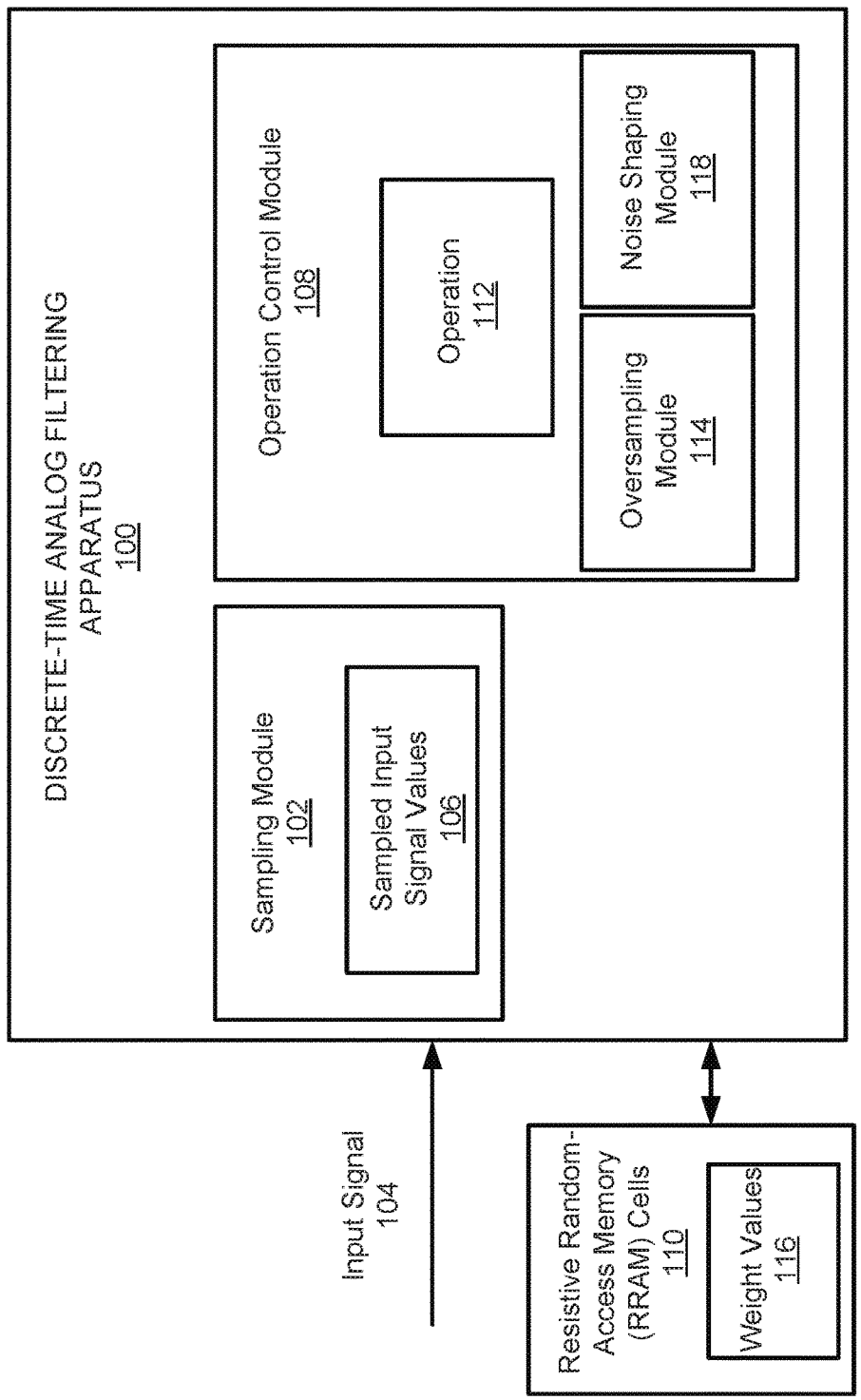
FIG. 1 illustrates an architecture of a discrete-time analog filtering apparatus, according to an example of the present disclosure.

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

When an analog value (e.g., a scalar) is quantized to a digital representation, the error between the original analog value and the digital representation may be denoted as quantization error. Collectively, as when a discrete-time analog signal (e.g., a vector) is converted to a digital sequence, the discrete-time analog signal may be denoted as quantization noise. According to an example, a total quantization noise energy may be proportional to the least significant bit (LSB) size of the digital representation (e.g., a smaller LSB step is proportional to the lower total quantization noise energy). The quantized signal may be expressed as the sum of the original (noise-less) analog signal plus the quantization noise signal.

Oversampling discrete-time signals may increase the bandwidth of the associated discrete-time signal. In this respect, frequencies between the Nyquist limit of the original sampled signal, and the Nyquist limit of the new oversampled signal, may become viable.

Since quantization noise energy is a function of the digital LSB (i.e., quantization noise energy is fixed, and independent of bandwidth), oversampling a discrete-time (digitized) sequence may result in the quantization noise energy to uniformly spread across a wider bandwidth, reducing the amount of in-band quantization noise energy. This aspect of quantization noise energy provides for a 3 dB improvement in signal-to-noise ratio (SNR) for each doubling of the sampling rate (i.e., the noise spectral density decreases by a factor of two for each doubling of the bandwidth).

A mechanism for displacing quantization noise energy from the baseband may include noise shaping. In this regard, oversampling may be used to provide a disposal area for the noise energy, but additional manipulations may be imposed on the noise signal such that the noise signal is attenuated in-band at the expense of amplifying the noise signal in the higher (disposal) frequencies made available by oversampling. In order to implement noise shaping, as an analog sample is quantized, the quantization error at the point of quantization may be measured, and the quantization error value may be taken into consideration during subsequent samples' quantization steps. In this regard, noise shaping processes may differentiate the noise by averaging the noise out at low frequencies (a low frequency signal has nearly the same value from point to point, thus differentiating may leave the relatively small point-to-point change), while accentuating the noise at high frequencies (high frequencies may differ from point to point, thus differentiating may produce relatively large point-to-point changes).

With respect to Multiply-Accumulate (MAC) operations, since convolution in the time-domain equates to multiplication in the frequency domain (and vice-versa), convolution of a noise shaped signal with either another noise shaped signal or a noise-free signal produces a normal (i.e., noise-less, or at least low-noise, depending on the efficacy of the noise shaping) result in-band. Further, with respect to convolution of a noise shaped signal with either another noise shaped signal or a noise-free signal, what occurs in the disposal band (noise operating on noise) may not be of interest.

With respect to discrete-time filtering, one of the two convolution input signals may include a finite impulse response (i.e., a non-infinite sequence of values that is relatively shorter than the other input signal) that is repeatedly used in the convolution determination as the finite impulse response is swept along the entirety of the other input signal. This shorter sequence may be denoted as the convolution kernel. The convolution kernel may represent a matrix of weights in a convolution.

A discrete-time convolution may be performed as a sequence of MAC operations, with each value of the kernel multiplied by a value in the input signal, and the products being summed to produce one sample in an output sequence. For a next sample in the output sequence, the entire kernel may be shifted along the input sequence by one value, and the MAC may be repeated. This process may be repeated until the entire output sequence has been determined.

Resistive random-access memory (RRAM) cells are capable of storing analog values. However, under certain conditions, control over the written value may be limited. The limitations on control over the written value may interfere with the use of memristors in analog computations. For example, when an analog signal is sampled and the samples are inaccurately represented (e.g., in certain cases, storing an analog signal on an array of memristors), the corrupted signal may be analyzed as the sum of the original (noise-less) analog signal, plus the error signal. Under certain conditions, this error signal may be noise shaped out of the baseband, and into a disposal band generated by oversampling.

In order to address the aforementioned aspects related to RRAM cells, a discrete-time analog filtering apparatus and a method for discrete-time analog filtering are disclosed herein. For the apparatus and method disclosed herein, any arbitrary level of accuracy in a computation (e.g., an analog computation) may be obtained based on oversampling and noise shaping. Thus, the accuracy may be increased based on the use of further RRAM cells. For the apparatus and method disclosed herein, errors may be noise shaped out of the baseband, where the errors may remain for the duration of a computation.

The apparatus and method disclosed herein may further include a circuit to provide for efficient and accurate determination of a MAC (i.e., a dot product) using memristor cells and, and noise shaping of the values related to the determination of the MAC. The apparatus and method disclosed herein may thus provide for efficient and accurate determination of a MAC (e.g., an analog MAC) by using memristor cells whose stored values are oversampled and noise shaped in order to retain accuracy in the MAC computation.

FIG. 1 illustrates an architecture of a discrete-time analog filtering apparatus (hereinafter also referred to as "apparatus 100"), according to an example of the present disclosure. Referring to FIG. 1, the apparatus 100 is depicted as including a sampling module 102 to receive an input signal 104, and to sample the input signal 104 to determine sampled input signal values 106 related to the input signal 104. An operation control module 108 may use a plurality of resistive random-access memory (RRAM) cells 110 to perform an operation 112 on the sampled input signal values 106. For example, the operation control module 108 may use the plurality of RRAM cells 110 to perform a Multiply-Accumulate (MAC) operation on the sampled input signal values 106. According to an example, the RRAM cells 110 may include memristors.

The operation control module 108 may include an oversampling module 114 to perform the operation 112 on the sampled input signal values 106 by oversampling the input signal 104 and weight values 116 stored in the RRAM cells 110. The weight values 116 may represent coefficients for a convolution related to the MAC operation. In this regard, the weight values 116 may correspond to kernel values for the MAC operation. Further, the operation control module 108 may include a noise shaping module 118 to perform the operation 112 on the weight values 116 by noise shaping the weight values 116 stored in the RRAM cells 110. In this regard, the noise shaping module 118 may also noise shape the input signal values 106.

Figure 2:
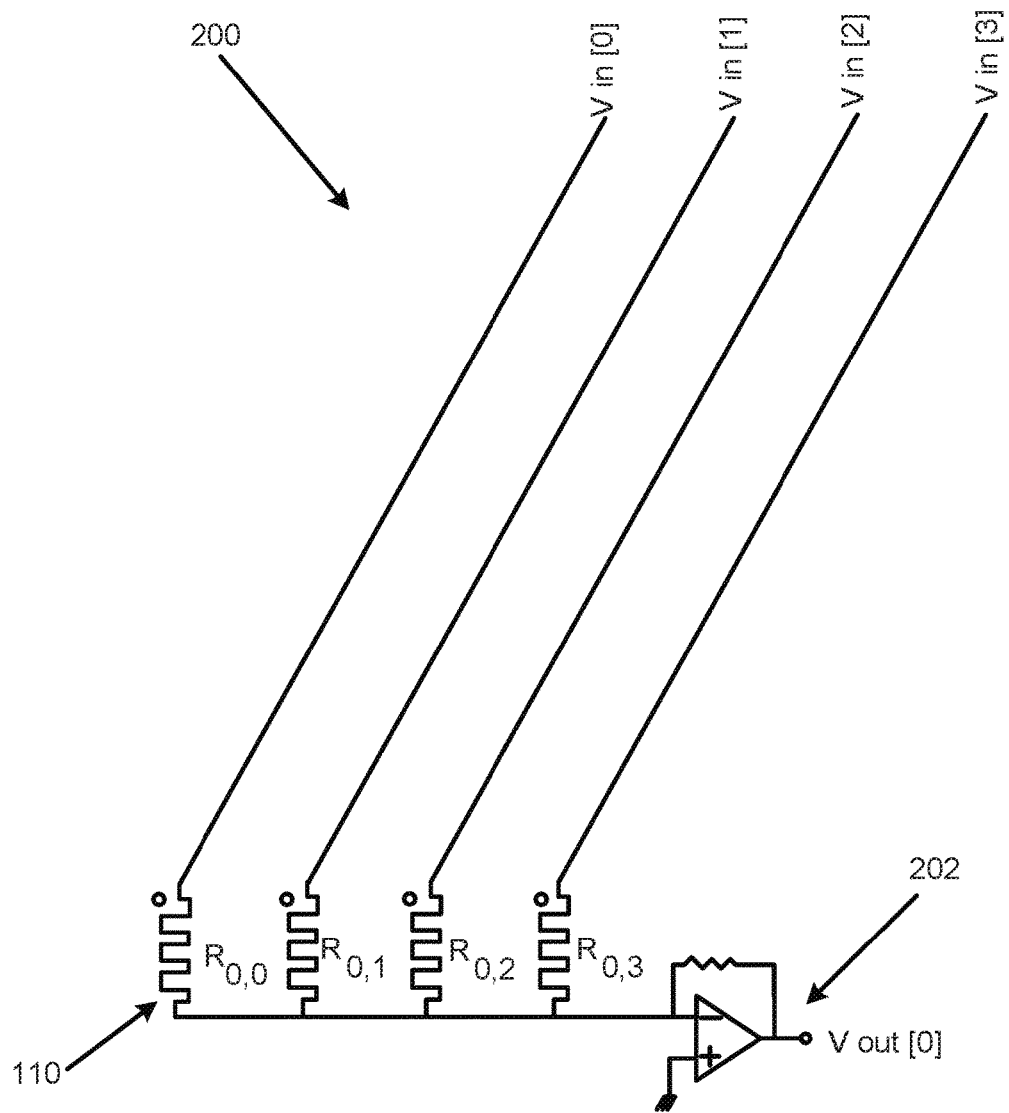
FIG. 2 illustrates a circuit for performance of an error-free analog Multiply-Accumulate (MAC) using programmed resistive random-access memory (RRAM) cells and including a one-dimensional kernel, according to an example of the present disclosure.

FIG. 2 illustrates a circuit 200 for performance of an error-free analog MAC using programmed RRAM cells and including a one-dimensional kernel, according to an example of the present disclosure.

Referring to FIGS. 1 and 2, the operation control module 108 may perform an error-free analog MAC using programmed RRAM cells 110 (e.g., memristors), denoted $R_{0,0}$-$R_{0,3}$. For the example of FIG. 2, the operation control module 108 may store the values for a four-sample kernel in the RRAM cells $R_{0,0}$-$R_{0,3}$. However, any number of kernel values may be stored in RRAM cells (e.g., generally, $R_{0,0}$, $R_{0,1}$ ... $R_{0,n}$). The four-sample kernel may represent values for a weight vector (i.e., the coefficients of a filter, or the coefficients of a convolution kernel) for performing a MAC operation. For example, the four-sample kernel may include values 25 KΩ, 125 KΩ, 25 KΩ, and 125 KΩ, respectively, for the RRAM cells $R_{0,0}$-$R_{0,3}$.

As described herein, the coefficients of a convolution kernel may be multiplied with the input signal 104 represented by the voltage values $V_{in}[0]$, $V_{in}[1]$, etc. For each of the RRAM cells $R_{0,0}$-$R_{0,3}$, a current, for example, for $V_{in}[0]$ and $R_{0,0}$, may be determined as $V_{in}[0]*G_{0,0}$, where $G_{0,0}$ may represent the conductance for $R_{0,0}$, and the current is proportional to the kernel value for $R_{0,0}$ (other currents at $R_{0,1}$-$R_{0,3}$ may be similarly determined). The currents related to the input signal including $V_{in}[0]$-$V_{in}[3]$, and the RRAM cells $R_{0,0}$-$R_{0,3}$ may be respectively summed at the negative input node of the operational amplifier 202, amplified, and output as $V_{out}[0]$.

With respect to the example of FIG. 2, the RRAM cells $R_{0,0}$-$R_{0,3}$ may not be precisely programmable to store the four-sample kernel. For example, compared to the values 25 KΩ, 125 KΩ, 25 KΩ, and 125 KΩ, for the respective RRAM cells $R_{0,0}$-$R_{0,3}$ (where the ideal values to be stored may be designated as intended values), the actual measured values at the respective RRAM cells $R_{0,0}$-$R_{0,3}$ may be 29 KΩ, 122 KΩ, 28 KΩ, and 145 KΩ.

Figure 3:
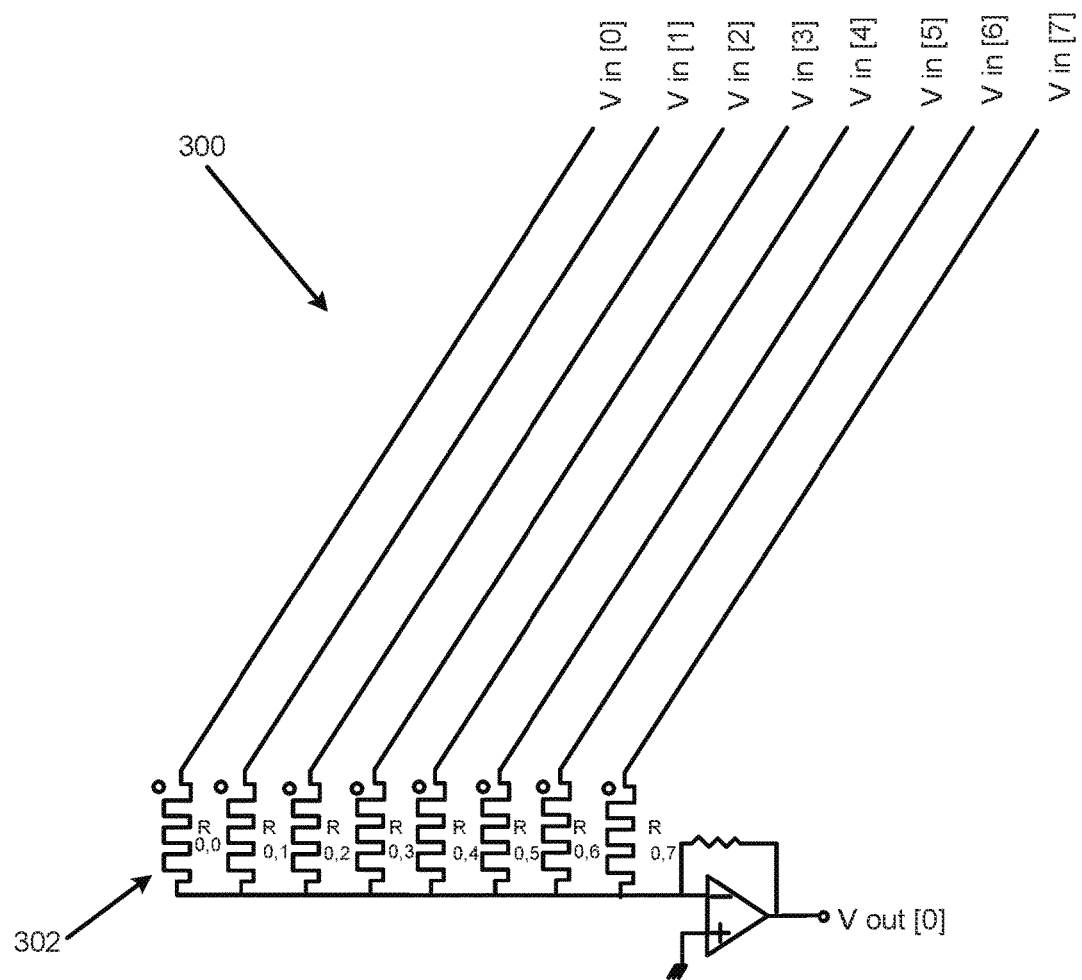
FIG. 3 illustrates oversampling of the input signal vector and the kernel values stored in the RRAM cells of FIG. 2, according to an example of the present disclosure.

FIG. 3 illustrates oversampling of the input signal vector and the kernel values (i.e., weight vector) stored in the RRAM cells 110 of FIG. 2, according to an example of the present disclosure.

Referring to FIG. 3, the oversampling module 114 may oversample (as shown at 300) the four-sample kernel values stored in the RRAM cells (including the RRAM cells $R_{0,0}$-$R_{0,3}$), and the input signal vector (e.g., $V_{in}[0]$-$V_{in}[3]$). For the example of FIGS. 2 and 3, the four-sample kernel values stored in the RRAM cells 110 may be oversampled by a factor of two, but other oversampling rates such as four, eight, etc., may be used. For the example of FIGS. 2 and 3, the oversampling may effectively double the available bandwidth (based on the factor of two oversampling), for example, from 100 KHZ to 200 KHZ.

Figure 4:
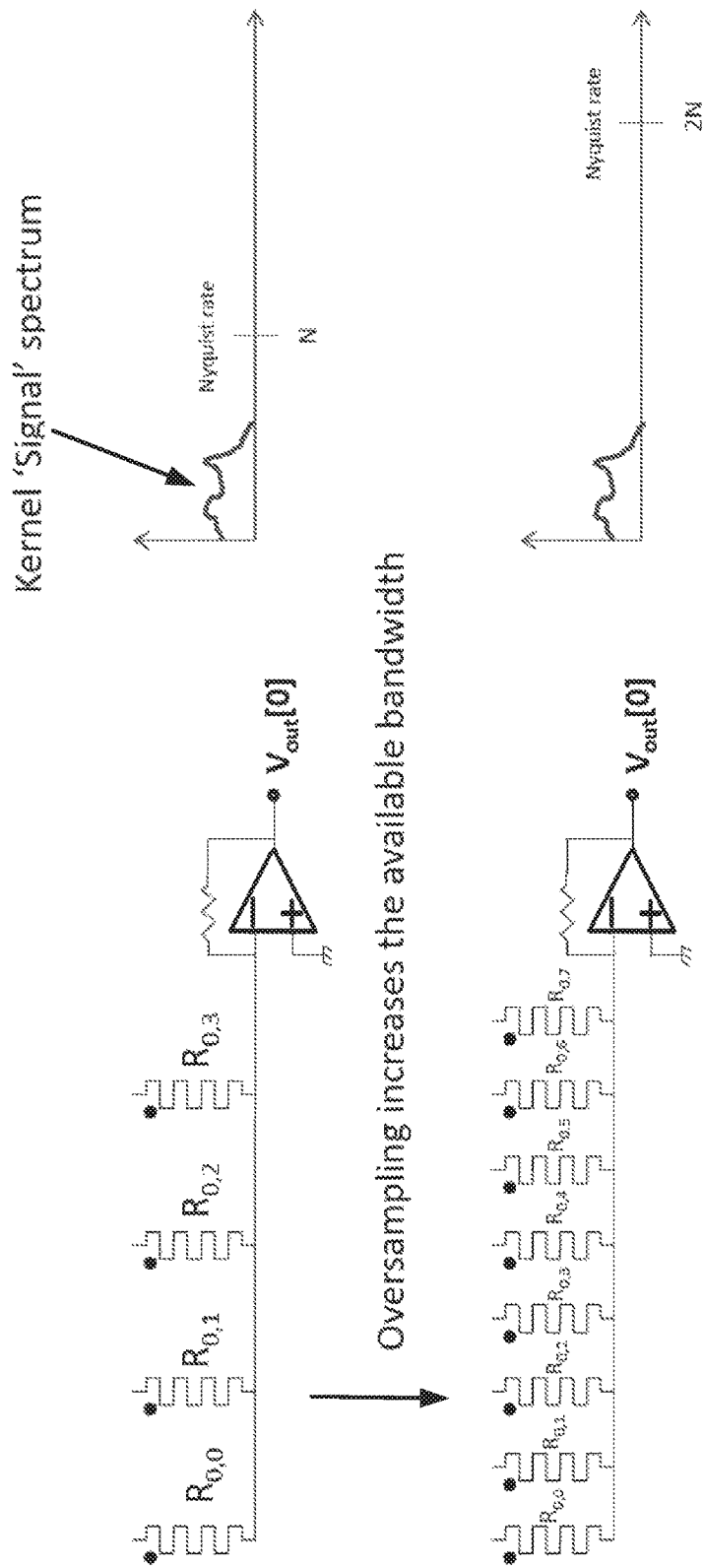
FIG. 4 illustrates increase of available bandwidth based on oversampling, according to an example of the present disclosure.

For example, FIG. 4 illustrates increase of available bandwidth based on oversampling, according to an example of the present disclosure. As shown in FIG. 4, the oversampling may effectively double the available bandwidth (based on the factor of two oversampling), and the Nyquist rate from N to 2N.

Referring to FIG. 3, the noise shaping module 118 may noise shape (i.e., the input signal, V, may be error-free or include noise shaped error) the kernel values stored in RRAM cells 302 to produce a noise shaped convolution kernel. In this manner, as described herein, errors may be noise shaped out of the baseband (e.g., out of the 0 KHZ to 100 KHZ range of the baseband, and into the 100 KHZ to 200 KHZ range based on oversampling), where the errors may remain for the duration of the computation.

Figure 5:
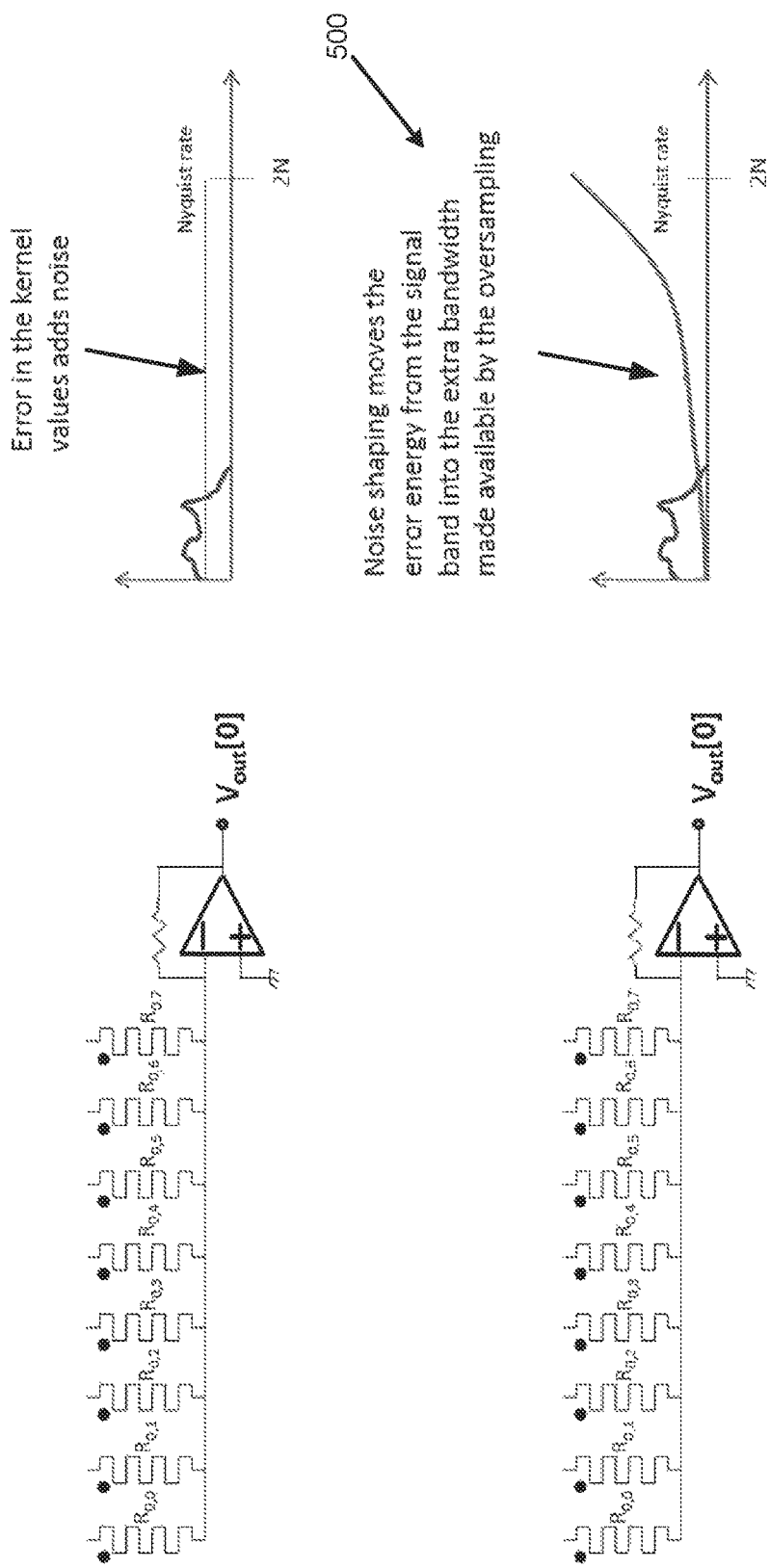
FIG. 5 illustrates noise shaping of errors out of the baseband, according to an example of the present disclosure.

For example, FIG. 5 illustrates noise shaping of errors out of the baseband, according to an example of the present disclosure. As shown in FIG. 5, at 500, noise shaping may move the error energy from the signal band into the extra bandwidth made available by oversampling.

After oversampling, for example, by adding intermediate samples to the sequence, and low pass filtering to determine the values of the new samples, the noise shaping module 118 may perform the noise shaping, for example, for the oversampled kernel values stored in the RRAM cells 302.

Figure 6:
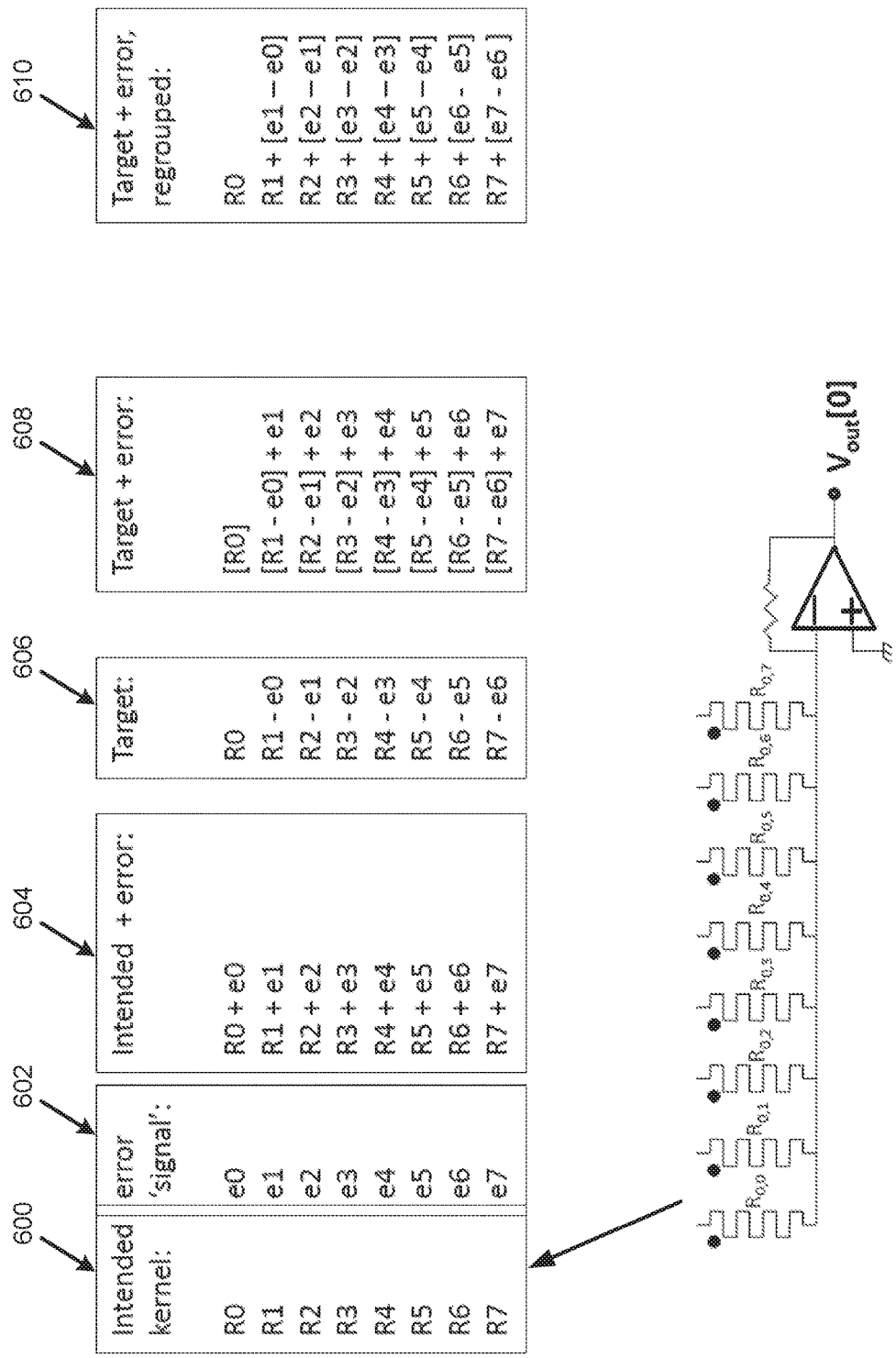
FIGS. 6 and 7 illustrate noise shaping for the oversampled RRAM cells of FIG. 2, according to an example of the present disclosure.
Figure 7:
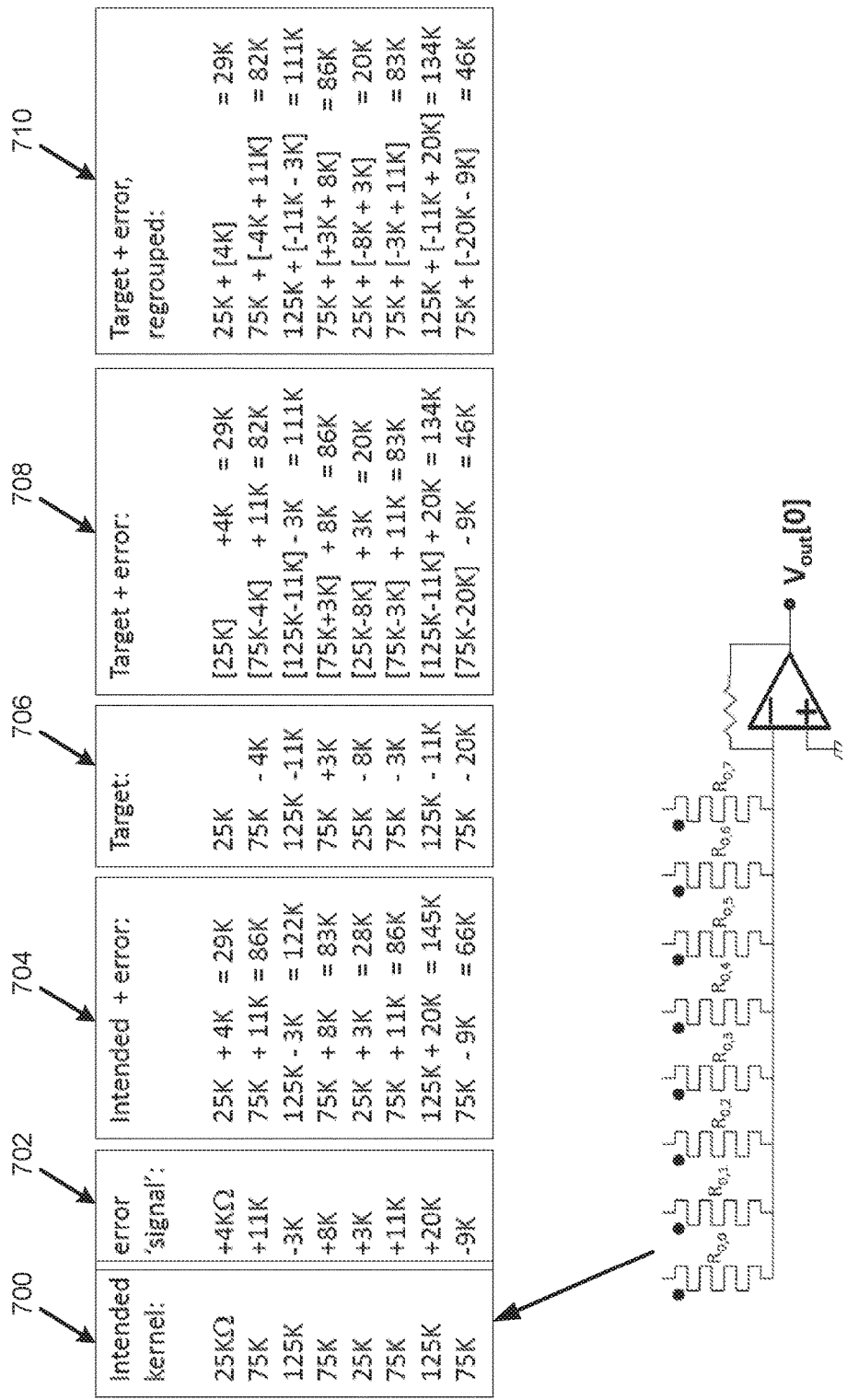

With respect to noise shaping, FIGS. 6 and 7 illustrate noise shaping for the oversampled RRAM cells of FIG. 2, according to an example of the present disclosure.

Referring to FIG. 6, according to an example, the intended kernel values (i.e., the kernel values that are to be written in the RRAM cells) are listed at 600, the error signal between the intended kernel values and what is actually written in a RRAM cell are listed at 602, and the values without noise shaping are listed at 604. Further, target kernel values (i.e., the values that are to be written, taking the measured error of the last value into account) are listed at 606, the target kernel values and error (i.e., the result of noise shaping) are listed at 608, and the re-grouped target kernel values and error are listed at 610. With respect to the re-grouped target kernel values and error listed at 610, it can be seen that these values represent the original signal plus the first difference of the error signal (i.e., the error is differentiated, which attenuates the error at low frequencies (where the signal is) at the expense of amplifying the error at high frequencies (where the signal is not; i.e., the noise spectrum is shaped)).

Referring to FIG. 7, according to a numerical example related to FIG. 6, the intended kernel values are listed at 700, the error signal between the intended kernel values and what is actually written in a RRAM cell are listed at 702, and the values without noise shaping are listed at 704. Further, target kernel values are listed at 706, the target kernel values and error are listed at 708, and the re-grouped target kernel values and error are listed at 710.

FIGS. 6 and 7 are described in further detail with reference to FIGS. 1-3.

Referring to FIGS. 1-3, 6, and 7, the noise shaping may include writing an intended value into $R_{0,0}$, and then measuring the error (e.g., the difference between the intended value for $R_{0,0}$ and the value that is actually written into $R_{0,0}$), $e_{0,0}$. For example, referring to FIGS. 6 and 7, the noise shaping may include writing an intended value of 25 KΩ into $R_{0,0}$ (i.e., R0 from columns 600 and 700 of FIGS. 6 and 7) and then measuring the error (e.g., the difference between the intended value for $R_{0,0}$ and the value of 29 KΩ that is actually written into $R_{0,0}$), $e_{0,0}$ of +4 KΩ (i.e., e0 from column 602 of FIG. 6, and corresponding +4 KΩ error signal from column 702 of FIG. 7). When writing $R_{0,1}$, a target value (columns 606 and 706 of FIGS. 6 and 7) may be determined as the intended value written into $R_{0,1}$ (e.g., 75 KΩ) minus the error $e_{0,0}$ (i.e., $R_{0,1}-e_{0,0}$; 4 KΩ), leading to a stored result of $R_{0,1}+(e_{0,1}-e_{0,0})$ (e.g., 82 KΩ), where $e_{0,1}$ is the difference between what was intended for $R_{0,1}$ (i.e., the target value of $R_{0,1}-e_{0,0}$) and the value that is actually written into $R_{0,1}$ (i.e., $R_{0,1}+(e_{0,1}-e_{0,0})$). $R_{0,2}$ may then be targeted with $R_{0,2}-e_{0,1}$, but produce $R_{0,2}+(e_{0,2}-e_{0,1})$, and so forth. For the examples of FIGS. 1-3, 6, and 7, the resulting sequence based on oversampling and noise shaping may be specified as follows:

$$[R_{0,0}+R_{0,1}+R_{0,2}+R_{0,3}+R_{0,4}+R_{0,5}+R_{0,6}+R_{0,7}]+[e_{0,0}+\\(e_{0,1}-e_{0,0})+(e_{0,2}-e_{0,1})+(e_{0,3}-e_{0,2})+(e_{0,4}-e_{0,3})+\\(e_{0,5}-e_{0,4})+(e_{0,6}-e_{0,5})+(e_{0,7}-e_{0,6})]$$  Equation (1)

The resulting sequence of Equation (1) may include the form of the original (noise-free) signal and the noise shaped error signal, where the noise shaping module 118 may apply first order differentiation. The noise shaping module 118 may apply a variety of other noise shaping techniques.

Figure 8:
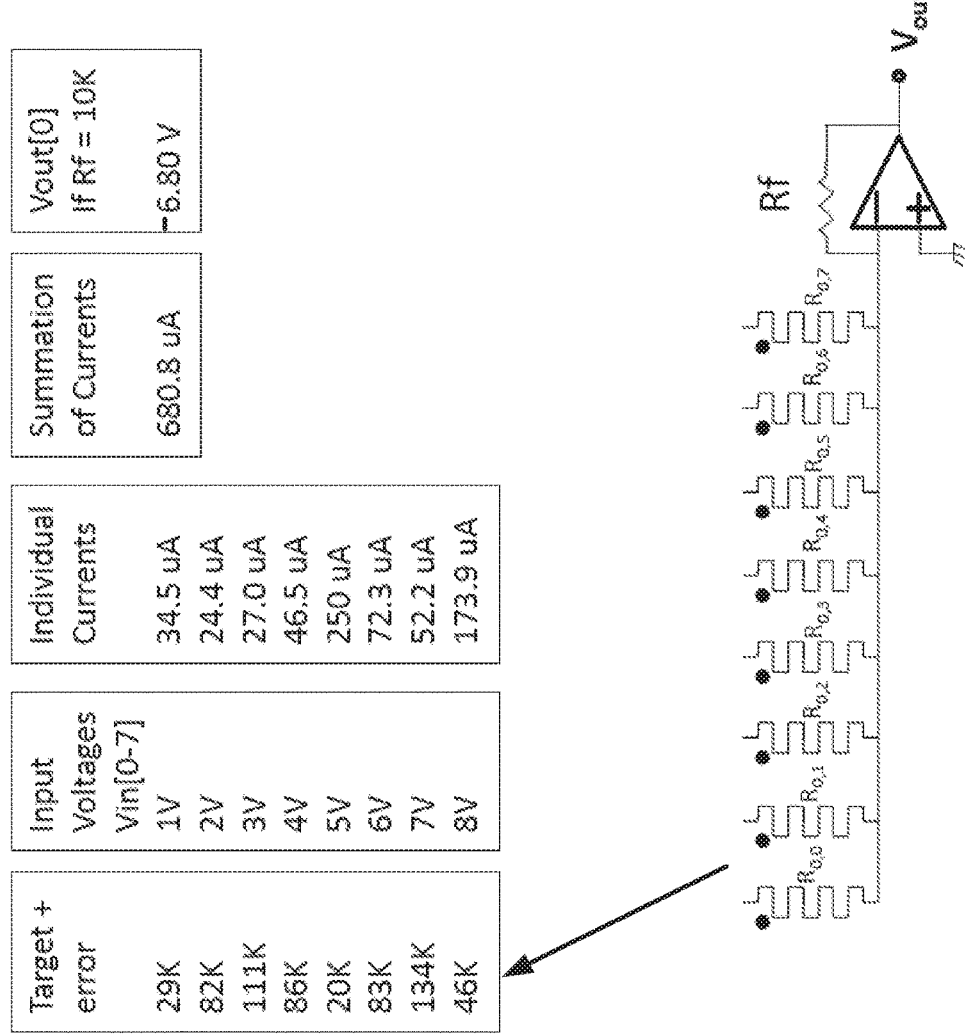
FIG. 8 illustrates determination of $V_{out}$, according to an example of the present disclosure.

FIG. 8 illustrates determination of $V_{out}$, according to an example of the present disclosure.

Referring to FIGS. 1-3 and 6-8, with respect to operation as a filter, the input sequence related to the input signal 104 may be applied on the input terminals $V_{in}$. Further, $V_{in}$ may be shifted over one sample for each MAC computation in the output sequence, producing $V_{out}$. For example, referring to FIG. 1, in order to determine $V_{out}[0]$, the inputs $V_{in}[0]$ through $V_{in}[3]$ may be applied to the inputs, in order to determine $V_{out}[1]$, the inputs $V_{in}[1]$ through $V_{in}[4]$ may be applied to the inputs, and so forth. In this regard, FIG. 1 shows limited inputs for $V_{in}$ (e.g., $V_{in}[0]$ through $V_{in}[3]$), however in practice, any number of inputs $V_{in}[0]\ldots V_{in}[n]$ may be provided. Similarly, for FIG. 2, in order to determine $V_{out}[0]$, the inputs $V_{in}[0]$ through $V_{in}[7]$ may be applied to the inputs, in order to determine $V_{out}[1]$ (i.e., the next value in the output stream), the inputs $V_{in}[1]$ through $V_{in}[8]$ may be applied to the inputs, and so forth. In this manner, the last value of $V_{out}$ for the output stream may correspond to the last eight $V_{in}$ values of the input stream. With respect to FIGS. 1-3 and 6-8, a numerical example of $V_{out}[0]$ for the inputs $V_{in}[0]$ through $V_{in}[7]$ applied to the inputs may be determined as shown in FIG. 8, resulting in a $V_{out}[0]$ of −6.80 V.

Figure 9:
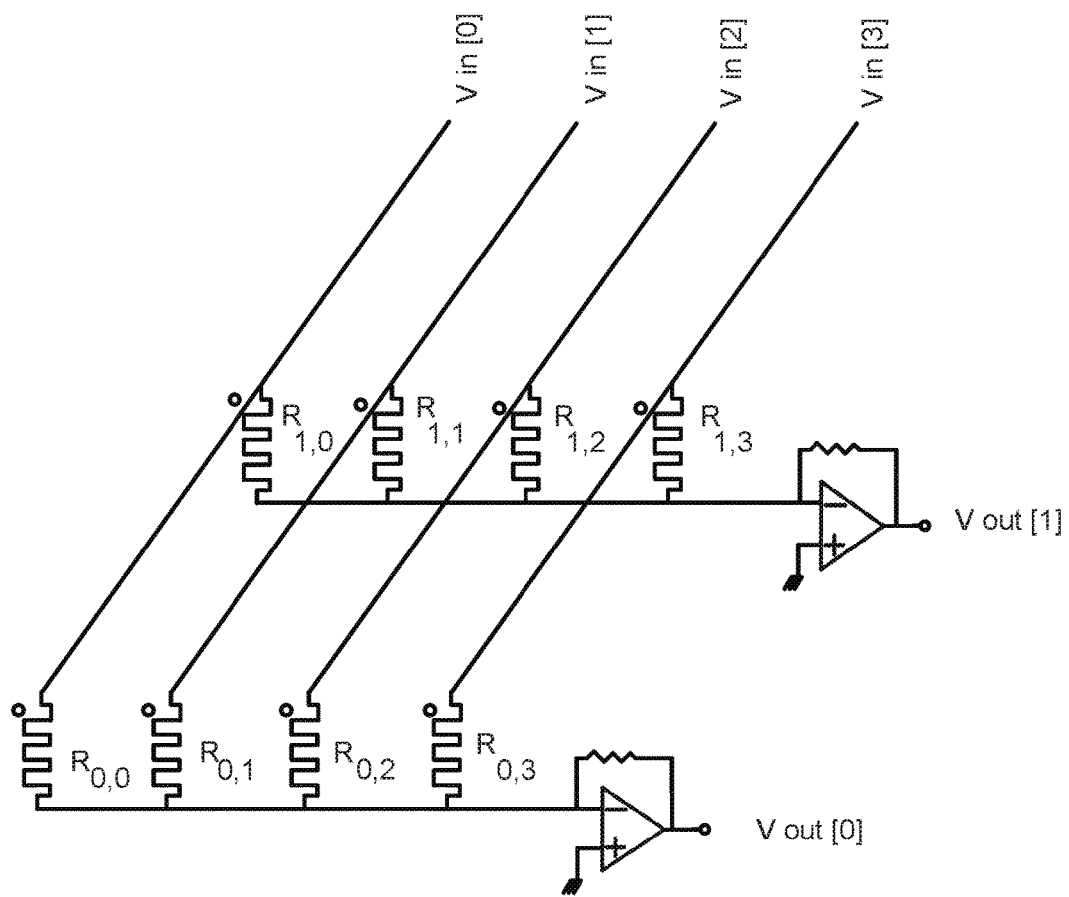
FIG. 9 illustrates a circuit for performance of an error-free analog MAC using programmed RRAM cells and including a two-dimensional kernel, according to an example of the present disclosure.
Figure 10:
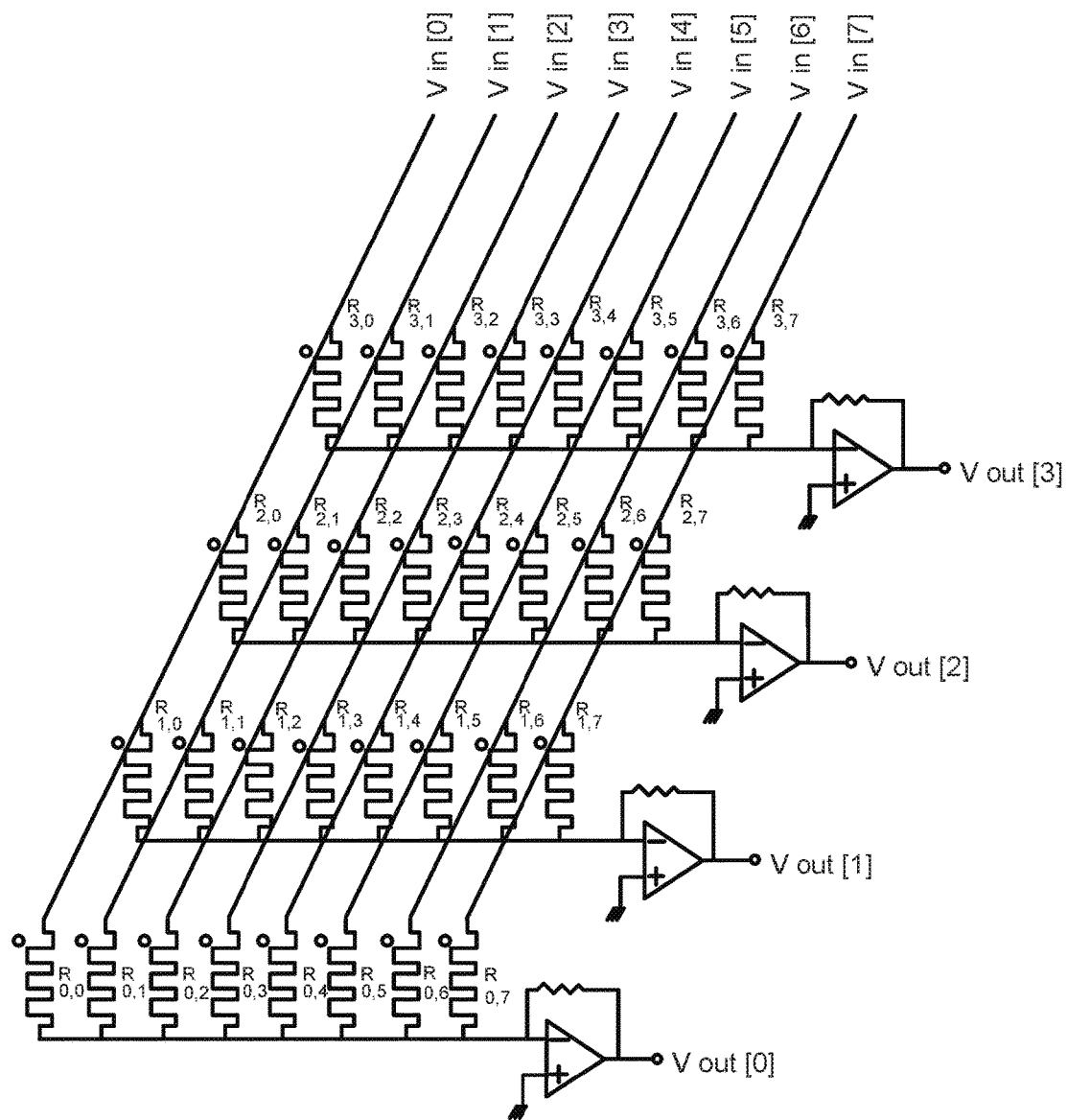
FIG. 10 illustrates oversampling of the input signal vector and the kernel values stored in the RRAM cells of FIG. 9, according to an example of the present disclosure.

Compared to the one-dimensional example of FIGS. 2 and 3, the oversampling module 114 and the noise shaping module 118 may operate with higher dimensional signals. For example, FIG. 9 illustrates a circuit for performance of an error-free analog MAC using programmed RRAM cells and including a two-dimensional kernel, according to an example of the present disclosure. Further, FIG. 10 illustrates oversampling of the input signal vector and the kernel values stored in the RRAM cells of FIG. 9, according to an example of the present disclosure. Generally, FIG. 9 may represent an example of an error-free kernel, and FIG. 10 may represent an example of a noise shaped kernel.

Referring to FIGS. 9 and 10, with respect to the errors at higher order rows (e.g., rows including $R_{1,0}-R_{1,7}$, $R_{2,0}-R_{2,7}$, etc.), the errors from previous rows and corresponding previous columns may be accounted for. For example, with respect to $R_{1,1}$, $R_{1,1}$ may account for the errors at $R_{0,0}$, $R_{0,1}$, and $R_{1,0}$.

The apparatus 100 may be used, for example, with respect to MAC operations related to signal processing areas such as discrete-time Fourier transform, discrete-time wavelet transform, a finite impulse response (FIR) or infinite impulse response (IIR) digital filter, cross-correlation, etc. The apparatus 100 may also be used, for example, with respect to other types of MAC operations, where dot-product operations are used. For example, dot-products may be used in Neural Networks (NN), where the k paints in a layer's computation may be specified as follows:

$$y_k[n]=f(\Sigma w_i \cdot x_i[n]+\theta_k)$$ Equation (2)

For Equation (2), θ may represent an offset (constant), and f(x) may represent a non-linear operation (e.g., an operation used to avoid clipping y or other behaviors when the sum becomes very large or very small, instead implementing a gradual, smooth approach to the limits of its range).

The modules and other elements of the apparatus 100 may be machine readable instructions stored on a non-transitory computer readable medium. In this regard, the apparatus 100 may include or be a non-transitory computer readable medium. In addition, or alternatively, the modules and other elements of the apparatus 100 may be hardware or a combination of machine readable instructions and hardware.

Figure 11:
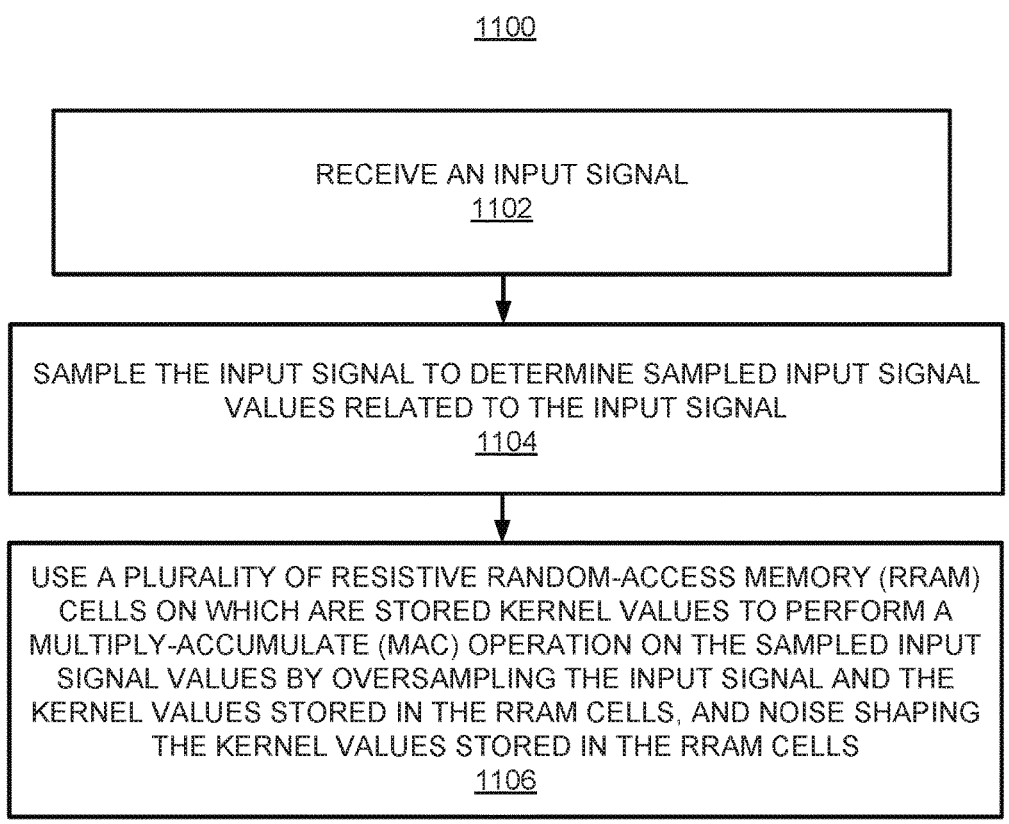
FIG. 11 illustrates a method for discrete-time analog filtering, according to an example of the present disclosure.
Figure 12:
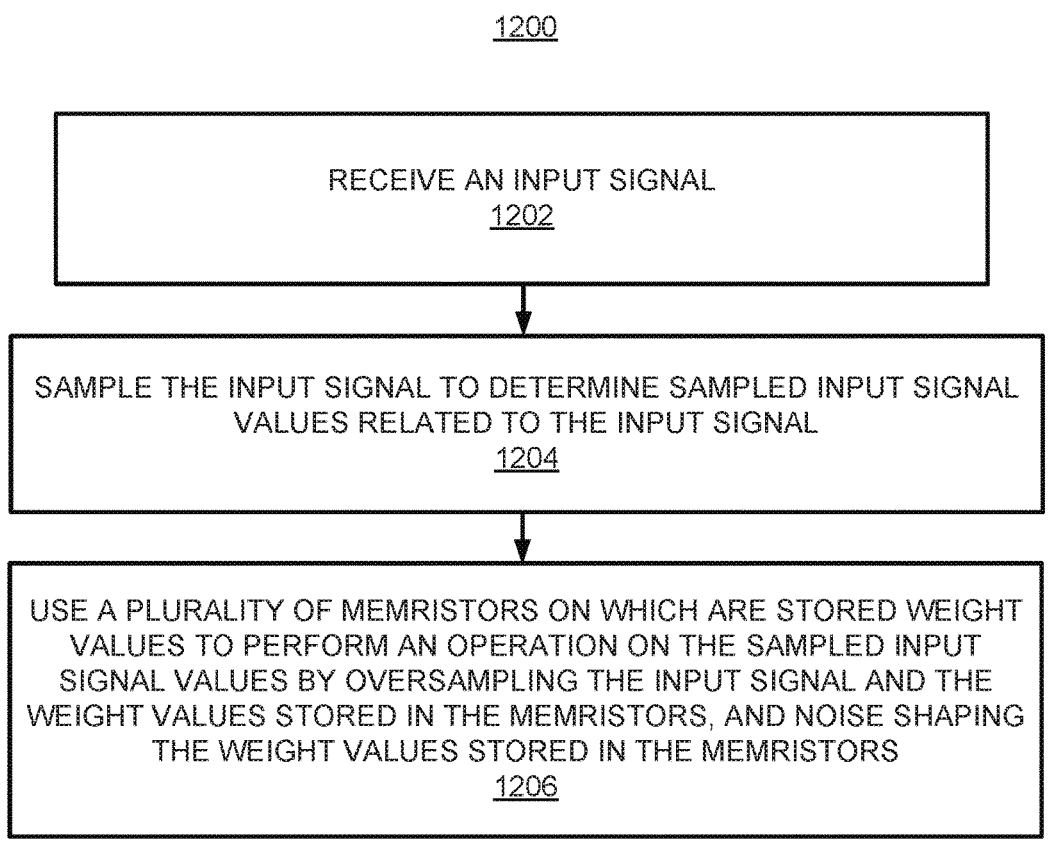
FIG. 12 illustrates further details of the method for discrete-time analog filtering, according to an example of the present disclosure.
Figure 13:
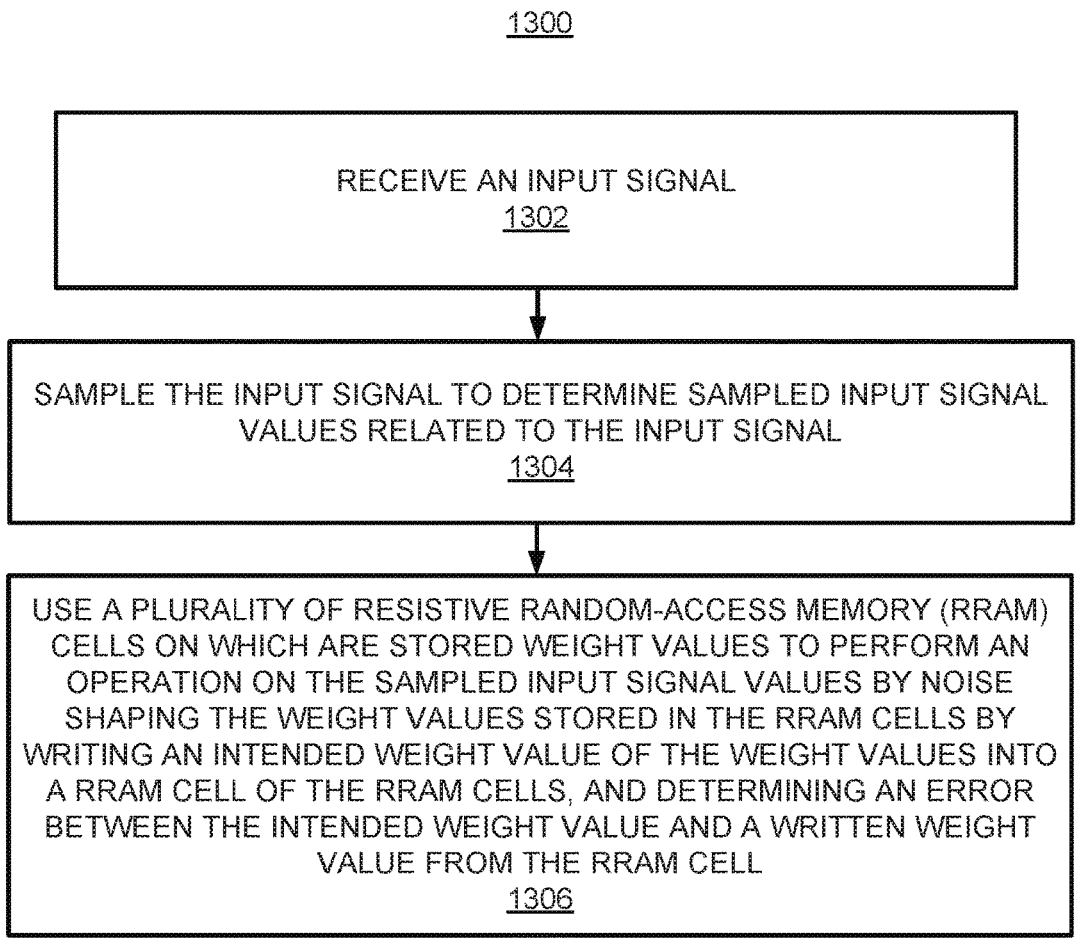
FIG. 13 illustrates further details of the method for discrete-time analog filtering, according to an example of the present disclosure.

FIGS. 11-13 respectively illustrate flowcharts of methods 1100, 1200, and 1300 for discrete-time analog filtering, corresponding to the example of the discrete-time analog filtering apparatus 100 whose construction is described in detail above. The methods 1100, 1200, and 1300 may be implemented on the discrete-time analog filtering apparatus 100 with reference to FIGS. 1-10 by way of example and not limitation. The methods 1100, 1200, and 1300 may be practiced in other apparatus.

Referring to FIG. 11, for the method 1100, at block 1102, the method may include receiving an input signal 104. For example, referring to FIG. 1, the sampling module 102 may receive an input signal 104.

At block 1104, the method may include sampling the input signal 104 to determine sampled input signal values 106 related to the input signal 104. For example, referring to FIG. 1, the sampling module 102 may sample the input signal 104 to determine sampled input signal values 106 related to the input signal 104.

At block 1106, the method may include using a plurality of RRAM cells 110 on which are stored kernel values to perform a MAC operation on the sampled input signal values 106 by oversampling the input signal 104 and kernel values stored in the RRAM cells 110, and noise shaping the kernel values stored in the RRAM cells 110. For example, referring to FIG. 1, the operation control module 108 may use a plurality of RRAM cells 110 on which are stored kernel value to perform a MAC operation on the sampled input signal values 106 by oversampling the input signal 104 and the kernel values stored in the RRAM cells 110, and noise shaping the kernel values stored in the RRAM cells 110.

According to an example, for the method 1100, using the plurality of RRAM cells 110 on which are stored kernel values to perform the MAC operation on the sampled input signal values 106 may further include determining, for each of the sampled input signal values 106 and corresponding kernel values stored in the RRAM cells 110, a product of a sample input signal value of the sampled input signal values 106 and a corresponding kernel value of the corresponding kernel values, and determining a sum of the products of each of the sampled input signal values 106 and the corresponding kernel values.

According to an example, for the method 1100, using the plurality of RRAM cells 110 on which are stored kernel values to perform the MAC operation on the sampled input signal values 106 by oversampling the input signal 104 and the kernel values stored in the RRAM cells 110 may further include oversampling the input signal 104 and the kernel values stored in the RRAM cells 110 by a predetermined oversampling value to increase an available bandwidth corresponding to the oversampling value.

According to an example, for the method 1100, as discussed herein with reference to FIGS. 6 and 7, using the plurality of RRAM cells 110 on which are stored kernel values to perform the MAC operation on the sampled input signal values 106 by oversampling the input signal 104 and the kernel values stored in the RRAM cells 110, and noise shaping the kernel values stored in the RRAM cells 110 may further include, for a RRAM cell of the RRAM cells 110, noise shaping the kernel values stored in the RRAM cells 110 by writing an intended kernel value of the kernel values into the RRAM cell, and determining an error between the intended kernel value and a written kernel value from the RRAM cell.

According to an example, for the method 1100, as discussed herein with reference to FIGS. 6 and 7, using the plurality of RRAM cells 110 on which are stored kernel values to perform the MAC operation on the sampled input signal values 106 by oversampling the input signal 104 and the kernel values stored in the RRAM cells 110, and noise shaping the kernel values stored in the RRAM cells 110 may further include, for a further RRAM cell of the RRAM cells 110, determining a target kernel value to be written into the further RRAM cell, where the target kernel value may be based on a further intended kernel value of the kernel values for the further RRAM cell and the error.

According to an example, for the method 1100, as discussed herein with reference to FIGS. 6 and 7, the target kernel value may be based on the further intended kernel value of the kernel values for the further RRAM cell minus the error.

According to an example, as discussed herein with reference to FIGS. 6 and 7, the method 1100 may further include determining a further error related to the target kernel value as a difference between the target kernel value and a further written kernel value from the further RRAM cell.

According to an example, for the method 1100, as discussed herein with reference to FIGS. 9 and 10, using the plurality of RRAM cells 110 on which are stored kernel values to perform the MAC operation on the sampled input signal values 106 by oversampling the input signal 104 and the kernel values stored in the RRAM cells 110, and noise shaping the kernel values stored in the RRAM cells 110 may further include, for a higher order RRAM cell of the RRAM cells 110, noise shaping the kernel values stored in the RRAM cells 110 by determining a higher order kernel value associated with the higher order RRAM cell by accounting for an error from a RRAM cell of a lower order adjacent row of RRAM cells 110, and a RRAM cell of a corresponding adjacent column.

Referring to FIG. 12, for the method 1200, at block 1202, the method may include receiving an input signal 104. For example, referring to FIG. 1, the sampling module 102 may receive an input signal 104.

At block 1204, the method may include sampling the input signal 104 to determine sampled input signal values 106 related to the input signal 104. For example, referring to FIG. 1, the sampling module 102 may sample the input signal 104 to determine sampled input signal values 106 related to the input signal 104.

At block 1206, the method may include using a plurality of memristors on which are stored weight values to perform an operation on the sampled input signal values 106 by oversampling the input signal 104 and weight values 116 stored in the memristors, and noise shaping the weight values 116 stored in the memristors. For example, referring to FIG. 1, the operation control module 108 may use a plurality of memristors on which are stored weight values 116 to perform an operation on the sampled input signal values 106 by oversampling the input signal 104 and weight values 116 stored in the memristors, and noise shaping the weight values 116 stored in the memristors.

According to an example, for the method 1200, the operation may include a MAC operation, and the weight values 116 may represent coefficients for a convolution related to the MAC operation.

Referring to FIG. 13, for the method 1300, at block 1302, the method may include receiving an input signal 104. For example, referring to FIG. 1, the sampling module 102 may receive an input signal 104.

At block 1304, the method may include sampling the input signal 104 to determine sampled input signal values 106 related to the input signal 104. For example, referring to FIG. 1, the sampling module 102 may sample the input signal 104 to determine sampled input signal values 106 related to the input signal 104.

At block 1306, the method may include using a plurality of RRAM cells 110 on which are stored weight values 116 to perform an operation on the sampled input signal values 106 by noise shaping weight values 116 stored in the RRAM cells 110 by writing an intended weight value of the weight values 116 into a RRAM cell of the RRAM cells 110, and determining an error between the intended weight value and a written weight value from the RRAM cell. For example, referring to FIGS. 1, 6, and 7, the operation control module 108 may use a plurality of RRAM cells 110 on which are stored weight values 116 to perform an operation on the sampled input signal values 106 by noise shaping weight values 116 stored in the RRAM cells 110 by writing an intended weight value of the weight values 116 into a RRAM cell of the RRAM cells 110, and determining an error between the intended weight value and a written weight value from the RRAM cell.

Figure 14:
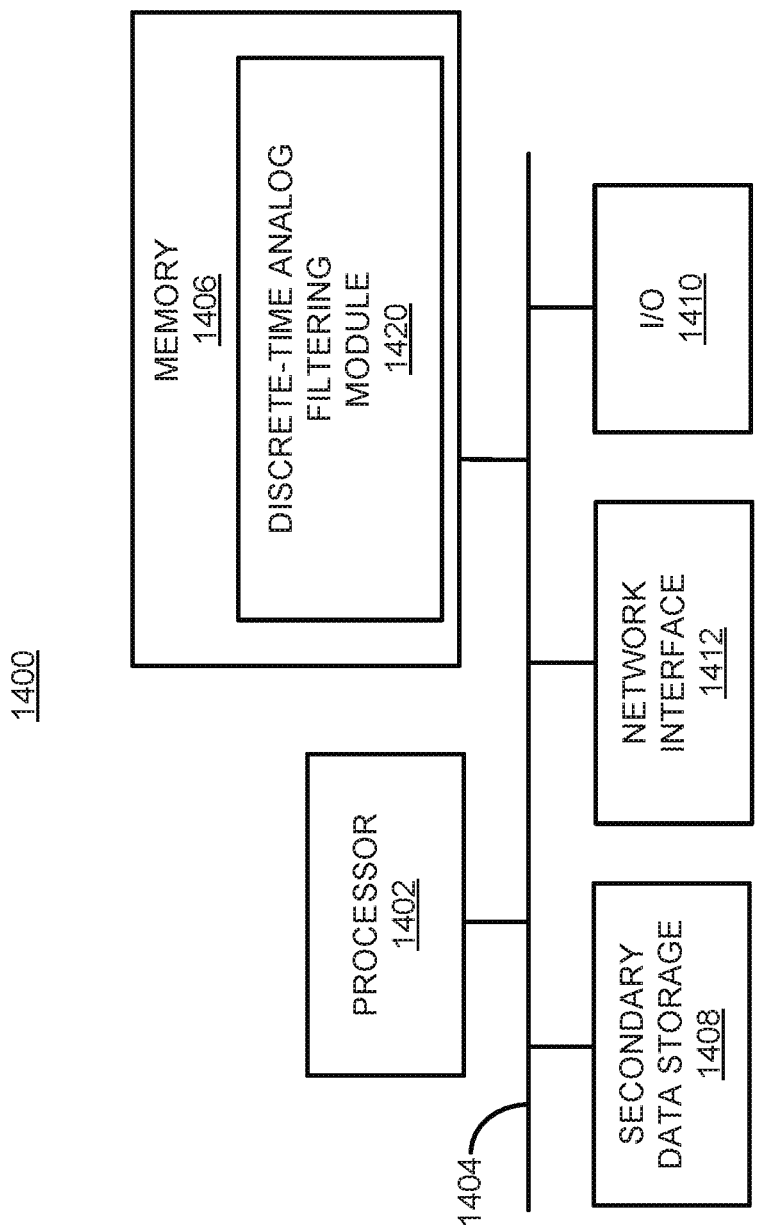
FIG. 14 illustrates a computer system, according to an example of the present disclosure.

FIG. 14 shows a computer system 1400 that may be used with the examples described herein. The computer system 1400 may represent a generic platform that includes components that may be in a server or another computer system. The computer system 1400 may be used as a platform for the apparatus 100. The computer system 1400 may execute, by a processor (e.g., a single or multiple processors) or other hardware processing circuit, the methods, functions and other processes described herein. These methods, functions and other processes may be embodied as machine readable instructions stored on a computer readable medium, which may be non-transitory, such as hardware storage devices (e.g., RAM (random access memory), ROM (read only memory), EPROM (erasable, programmable ROM), EEPROM (electrically erasable, programmable ROM), hard drives, and flash memory).

The computer system 1400 may include a processor 1402 that may implement or execute machine readable instructions performing some or all of the methods, functions and other processes described herein. Commands and data from the processor 1402 may be communicated over a communication bus 1404. The computer system may also include a main memory 1406, such as a random access memory (RAM), where the machine readable instructions and data for the processor 1402 may reside during runtime, and a secondary data storage 1408, which may be non-volatile and stores machine readable instructions and data. The memory and data storage are examples of computer readable mediums. The memory 1406 may include a discrete-time analog filtering module 1420 including machine readable instructions residing in the memory 1406 during runtime and executed by the processor 1402. The discrete-time analog filtering module 1420 may include the modules of the apparatus 100 shown in FIG. 1.

The computer system 1400 may include an I/O device 1410, such as a keyboard, a mouse, a display, etc. The computer system may include a network interface 1412 for connecting to a network. Other known electronic components may be added or substituted in the computer system.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. A method for discrete-time analog filtering, the method comprising:
   receiving an input signal;
   sampling, by a processor, the input signal to determine sampled input signal values related to the input signal; and
   using a plurality of resistive random-access memory (RRAM) cells on which are stored kernel values to perform a Multiply-Accumulate (MAC) operation on the sampled input signal values by
      oversampling the input signal and the kernel values stored in the RRAM cells, and
      noise shaping the kernel values stored in the RRAM cells, wherein the RRAM cells include memristors.

2. The method of claim 1, wherein using the plurality of RRAM cells on which are stored kernel values to perform the MAC operation on the sampled input signal values further comprises:
   determining, for each of the sampled input signal values and corresponding kernel values stored in the RRAM cells, a product of a sample input signal value of the sampled input signal values and a corresponding kernel value of the corresponding kernel values; and
   determining a sum of the products of each of the sampled input signal values and the corresponding kernel values.

3. The method of claim 1, wherein using the plurality of RRAM cells on which are stored kernel values to perform the MAC operation on the sampled input signal values by oversampling the input signal and the kernel values stored in the RRAM cells further comprises:
   oversampling the input signal and the kernel values stored in the RRAM cells by a predetermined oversampling value to increase an available bandwidth corresponding to the oversampling value.

4. The method of claim 1, wherein using the plurality of RRAM cells on which are stored kernel values to perform the MAC operation on the sampled input signal values by oversampling the input signal and the kernel values stored in the RRAM cells, and noise shaping the kernel values stored in the RRAM cells further comprises:

for a RRAM cell of the RRAM cells, noise shaping the kernel values stored in the RRAM cells by writing an intended kernel value of the kernel values into the RRAM cell; and determining an error between the intended kernel value and a written kernel value from the RRAM cell.

5. The method of claim 4, wherein using the plurality of RRAM cells on which are stored kernel values to perform the MAC operation on the sampled input signal values by oversampling the input signal and the kernel values stored in the RRAM cells, and noise shaping the kernel values stored in the RRAM cells further comprises:

for a further RRAM cell of the RRAM cells, determining a target kernel value to be written into the further RRAM cell, wherein the target kernel value is based on a further intended kernel value of the kernel values for the further RRAM cell and the error.

6. The method of claim 5, wherein the target kernel value is based on the further intended kernel value of the kernel values for the further RRAM cell minus the error.

7. The method of claim 5, further comprising:

determining a further error related to the target kernel value as a difference between the target kernel value and a further written kernel value from the further RRAM cell.

8. The method of claim 1, wherein using the plurality of RRAM cells on which are stored kernel values to perform the MAC operation on the sampled input signal values by oversampling the input signal and the kernel values stored in the RRAM cells, and noise shaping the kernel values stored in the RRAM cells further comprises:

for a higher order RRAM cell of the RRAM cells, noise shaping the kernel values stored in the RRAM cells by determining a higher order kernel value associated with the higher order RRAM cell by accounting for an error from a RRAM cell of a lower order adjacent row of RRAM cells, and a RRAM cell of a corresponding adjacent column.

9. A discrete-time analog filtering apparatus comprising:
a processor; and
a memory storing machine readable instructions that when executed by the processor cause the processor to:
receive an input signal;
sample the input signal to determine sampled input signal values related to the input signal; and
use a plurality of memristors on which are stored weight values to perform an operation on the sampled input signal values by
oversampling the input signal and the weight values stored in the memristors, and
noise shaping the weight values stored in the memristors.

10. The discrete-time analog filtering apparatus according to claim 9, wherein the operation is a Multiply-Accumulate (MAC) operation, and the weight values represent coefficients for a convolution related to the MAC operation.

11. The discrete-time analog filtering apparatus according to claim 9, wherein the machine readable instructions to use the plurality of memristors on which are stored weight values to perform the operation on the sampled input signal values by oversampling the input signal and the weight values stored in the memristors, and noise shaping the weight values stored in the memristors further comprise machine readable instructions to:

oversample the input signal and the weight values stored in the memristors by a predetermined oversampling value to increase an available bandwidth corresponding to the oversampling value.

12. A non-transitory computer readable medium having stored thereon machine readable instructions to provide discrete-time analog filtering, the machine readable instructions, when executed, cause a processor to:

receive an input signal;
sample the input signal to determine sampled input signal values related to the input signal;
use a plurality of resistive random-access memory (RRAM) cells on which are stored weight values to perform an operation on the sampled input signal values by
noise shaping the weight values stored in the RRAM cells by
writing an intended weight value of the weight values into a RRAM cell of the RRAM cells, and
determining an error between the intended weight value and a written weight value from the RRAM cell.

13. The non-transitory computer readable medium according to claim 12, wherein the machine readable instructions to use a plurality of RRAM cells on which are stored weight values to perform an operation on the sampled input signal values further comprise machine readable instructions to:

oversample the input signal and the weight values stored in the RRAM cells.

14. The non-transitory computer readable medium according to claim 12, wherein the machine readable instructions to noise shape the weight values stored in the RRAM cells further comprise machine readable instructions to:

determine, for a further RRAM cell of the RRAM cells, a target weight value to be written into the further RRAM cell, wherein the target weight value is based on a further intended weight value of the weight values for the further RRAM cell and the error.

* * * * *